(12) United States Patent
Liaw

(10) Patent No.: US 8,174,868 B2
(45) Date of Patent: May 8, 2012

(54) EMBEDDED SRAM STRUCTURE AND CHIP

(75) Inventor: Jhon Jhy Liaw, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 298 days.

(21) Appl. No.: 12/689,372

(22) Filed: Jan. 19, 2010

(65) Prior Publication Data

US 2011/0075470 A1    Mar. 31, 2011

Related U.S. Application Data

(60) Provisional application No. 61/247,156, filed on Sep. 30, 2009.

(51) Int. Cl.
*G11C 11/40* (2006.01)

(52) U.S. Cl. .......................................... 365/154; 365/72

(58) Field of Classification Search ................... 365/155, 365/156

See application file for complete search history.

(56) References Cited

U.S. PATENT DOCUMENTS

| | | | | |
|---|---|---|---|---|
| 5,554,874 A | * | 9/1996 | Doluca | 257/390 |
| 5,930,163 A | * | 7/1999 | Hara et al. | 365/154 |
| 7,471,545 B2 | * | 12/2008 | Nii | 365/154 |
| 7,936,579 B2 | * | 5/2011 | Anezaki et al. | 365/63 |

OTHER PUBLICATIONS

Arnaud, F. et al. "32nm General Purpose Bulk CMOS Technology for High Performance Applications at Low Voltage", IBM Semiconductor Research and Development Center (SRDC), ©2008, Hopewell Junction, NY, pp. 633-636.

* cited by examiner

*Primary Examiner* — Tan T. Nguyen
(74) *Attorney, Agent, or Firm* — Duane Morris LLP

(57) ABSTRACT

An embedded SRAM chip in a 32 nm or smaller technology generation includes a first SRAM array of first SRAM unit cells. Each first SRAM unit cell includes a data latch for data storage and at least two pass gates for data reading and writing access. The cell area is defined by a first X-pitch and a first Y-pitch, the X-pitch being longer than the Y-pitch. A plurality of logic transistors are formed outside of the first SRAM array, the plurality of logic transistors including at least first and second logic transistor having first and second gate pitches defined between their source and drain contacts. The second gate pitch is the minimum logic gate pitch for the plurality of logic transistors. The first Y-pitch is equal to twice the first gate pitch and the ratio of the first Y-pitch to twice the second logic gate pitch is greater than one.

21 Claims, 10 Drawing Sheets

EMBEDDED SRAM STRUCTURE AND CHIP

CROSS-REFERENCE TO RELATED APPLICATIONS

This application claims priority to U.S. Provisional Patent Application No. 61/247,156 entitled "Embedded SRAM Structure and Chip" filed Sep. 30, 2009, the entirety of which is hereby incorporated by reference herein.

FIELD OF THE INVENTION

The present invention relates generally to semiconductor devices, and more particularly to memory cells, and even more particularly to structures and layout designs of static random access memory cells.

BACKGROUND OF THE INVENTION

Static random access memories (SRAM) are commonly used in integrated circuits. Embedded SRAM is particularly popular in high speed communication, image processing and system on chip (SOC) applications. SRAM cells have the advantageous feature of holding data without requiring a refresh. Typically, a SRAM cell includes two pass-gate transistors, through which a bit can be read from or written into the SRAM cell. This type of SRAM cell is referred to as a single-port SRAM cell. Another type of SRAM cell is referred to as dual port SRAM cell, which includes four pass-gate transistors. FIGS. 1A, 1B and 1C are circuit diagrams of a six transistor single-port SRAM cell circuit, an eight transistor two-port SRAM cell circuit and an eight transistor dual-port SRAM cell circuit, respectively. As can be seen from the figures, the basic cell includes two cross-coupled inverters including two pull-up (PU) and two pull-down (PD) transistors, which form a data storage latch. One or more pass gate (PG) transistors are coupled between the differential bit lines (BL and BLB) for reading a bit from and/or writing a bit to the SRAM cell latch. The gates of the pass-gate transistors are controlled by a word line.

In deep sub-micron technology, the 6T single-port SRAM faces a speed/shrinkage barrier with respect to cell stability and Vcc-min performance. For cell speed improvement, the key factors are cell current, leakage current, cell N/P ratio, bit line loading and bit line couple effect. These factors determine the speed performance of the SRAM array. Cell stability and Vcc-min performance degrade as the power-supply voltage and cell size continue to shrink. As such, a low bit line coupling/loading effect cell structure will become a key element of embedded memory and SOC products. Having a short bit line reduces this coupling effect and is thus important to cell speed performance. A thin style cell layout (word-line length to bit-line length (i.e., X cell pitch:Y cell pitch) larger than 2 within a unit cell) is used to enhance cell speed.

Also, with the falling power-supply voltage and sizes of SRAM cells, decreasing amounts of charge are stored in the cells and poorer results for soft-error rate (SER) can be expected. In nanometer generations, the SER is a huge concern, likely more so than all the other reliability concerns combined. The SRAM cell design and device features impact the SER performance.

While optimizing SRAM cell device performance, the designer must not only be concerned with device performance, but also with Static Noise Margin (SNM) and transistor mismatch induced cell stability issues. The use of smaller cell transistors in small area cells places increased emphasis on these issues. Cell setting and optimization within a limited cell area is a major concern for realizing future cell shrinkage. In the past, designers used a narrow transistor pitch in the SRAM (when compared to transistor pitch of the surrounding logic transistors) to improve the shrink ratio. However, any gate length shrinkage to realize this narrower transistor pitch had to be accounted for in the device's control capability and data stability.

An improved SRAM design is desired.

SUMMARY OF THE INVENTION

An embedded SRAM chip in a 32 nm or smaller technology generation includes a first SRAM array of first SRAM unit cells. Each first SRAM unit cell includes a data latch for data storage and at least two pass gates for data reading and writing access. The cell area is defined by a first X-pitch and a first Y-pitch, the X-pitch being longer than the Y-pitch. A plurality of logic transistors are formed outside of the first SRAM array, the plurality of logic transistors including at least first and second logic transistor having first and second gate pitches defined between their source and drain contacts. The second gate pitch is the minimum logic gate pitch for the plurality of logic transistors. The first Y-pitch is equal to twice the first gate pitch and the ratio of the first Y-pitch to twice the second logic gate pitch is greater than one.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. In the description, terms concerning coupling and the like, such as "coupled," "connected" and "interconnected," refer to a relationship wherein components communicate with one another either directly or indirectly through intervening components, unless expressly described otherwise.

The term "gate poly" as used herein refers to the conductive lines used for forming gates of transistors, even if the conductive lines may be formed of conductive materials other than polysilicon, such as metals, metal silicides, metal nitrides, and combinations thereof.

As will be understood by those familiar with SRAM design, one measure of SRAM performance is cell array speed. The bit-lines are connected to sense amplifiers for signal comparison. The BL to BLB voltage differential determines the SRAM speed. The BL/BLB differential voltage can be improved in two ways, either by higher cell current or by lower bit line capacitance for RC delay reduction. Enlarging the channel width provides Ion boost for the SRAM cell but results in wider WL (cell X-pitch) and thus increased cell size. Shorter bit-lines (cell Y-pitch) have lower bit line coupling capacitance. The thin style SRAM cell structure (i.e., X:Y pitch >2 within a unit cell) is used to optimize cell performance in this regard. The new unit cell design rules described herein have particular applicability to these thin-style SRAM cells structures.

Figure 1A:
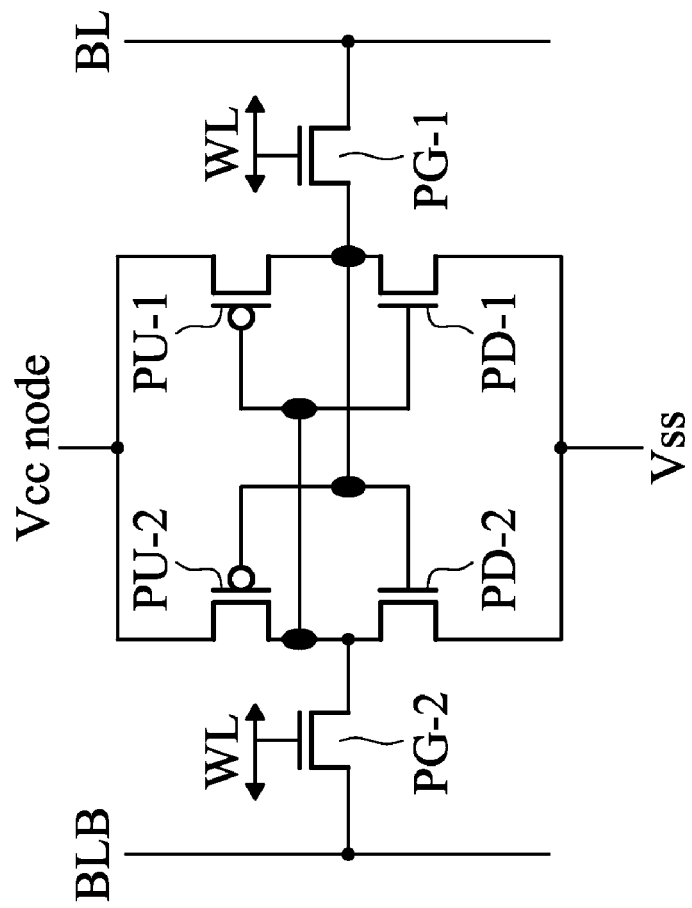
FIG. 1A is a circuit diagram of a prior art six transistor single-port SRAM cell.
Figure 1B:
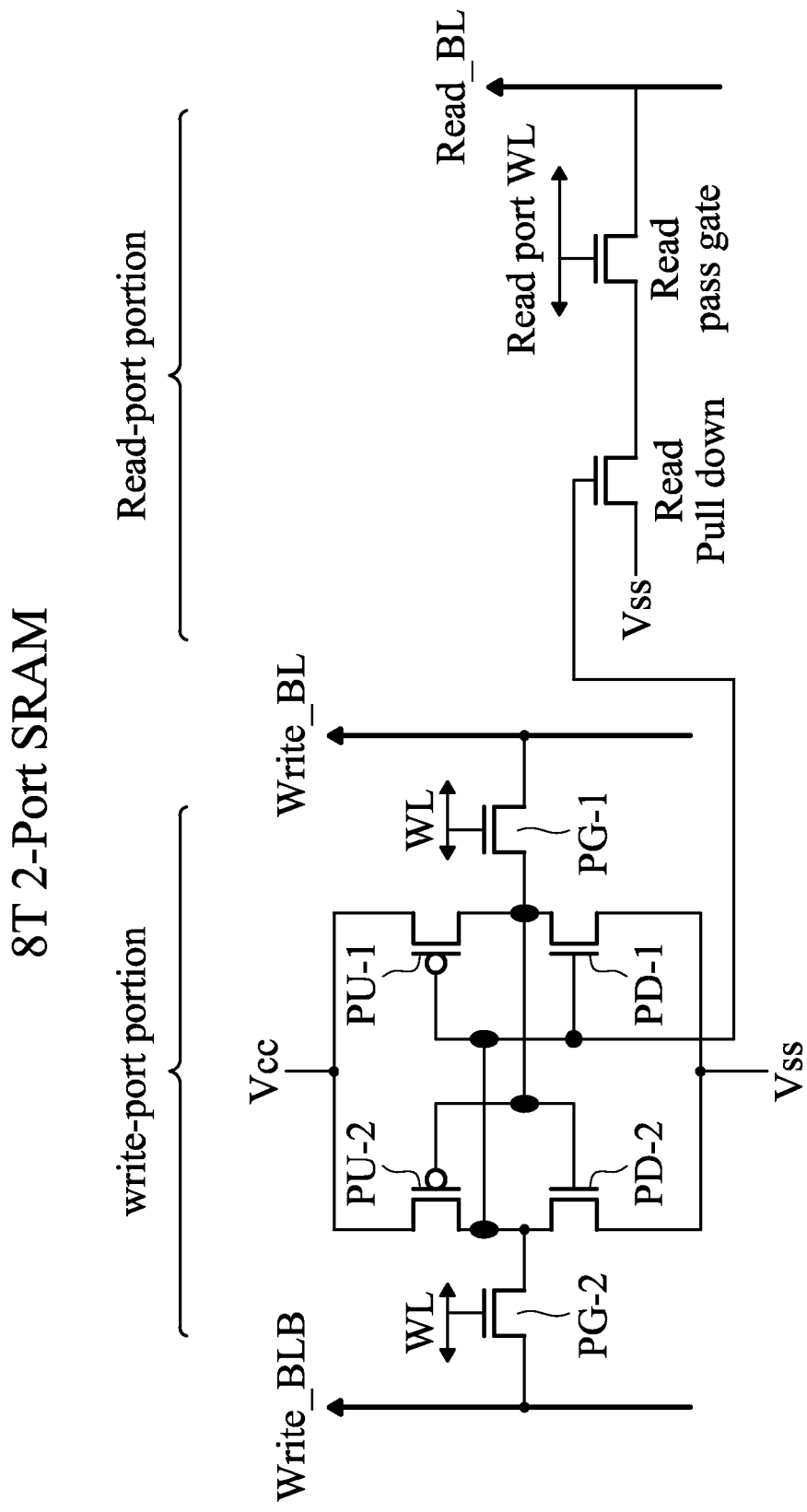
FIG. 1B is a circuit diagram of a prior art eight transistor two-port SRAM cell.
Figure 1C:
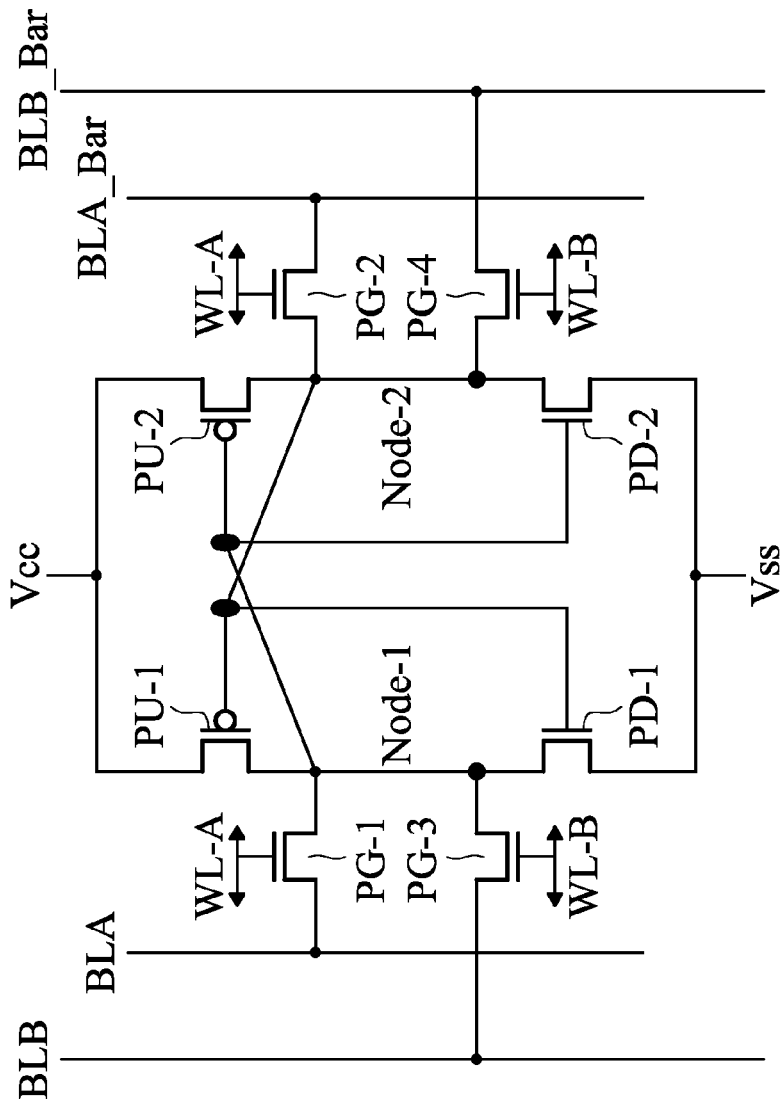
FIG. 1C is a circuit diagram of a prior art eight transistor dual-port SRAM cell.
Figure 2:
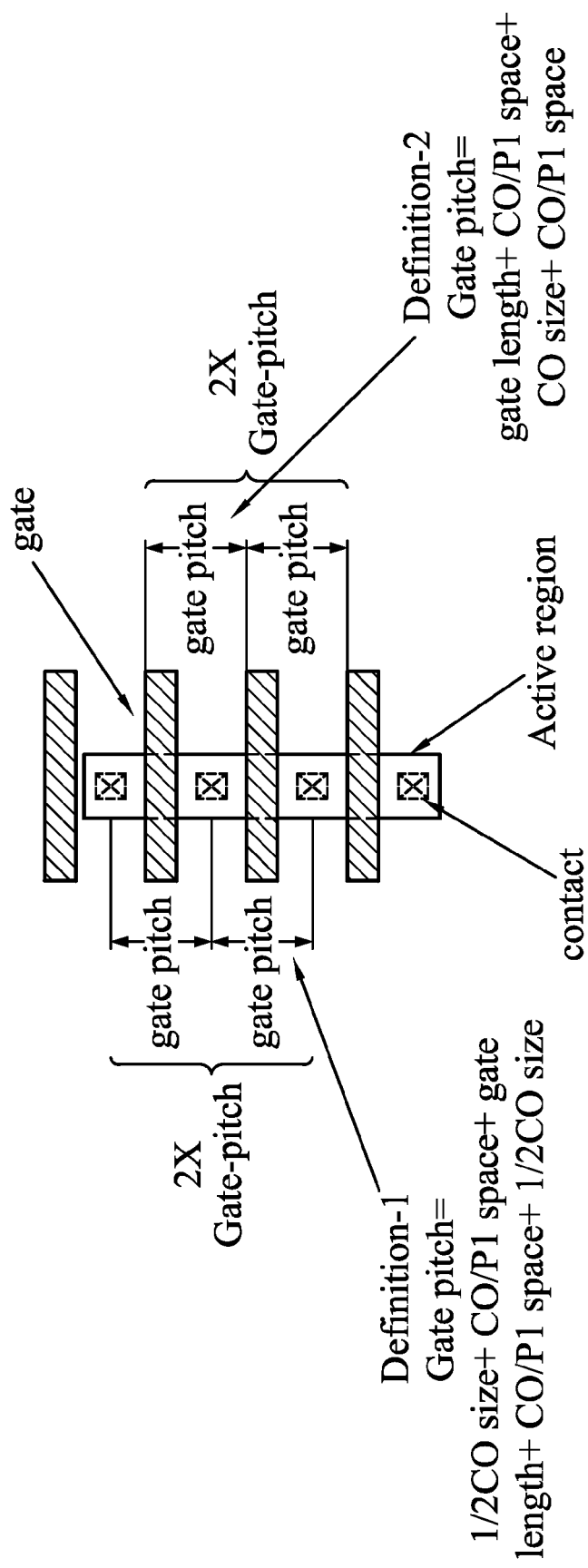
FIG. 2 illustrates a device layout for a plurality of transistors for purposes of defining gate pitch as used in the disclosure.

For existing thin style SRAM cell structures, the gate pitch ratio of transistors in the SRAM cell to those in the surrounding logic circuit is typically equal to or less than 1. This comparison is made with respect to the transistors connected to contacts in the surrounding logic circuit that have the smallest/minimum gate pitch. FIG. 2 shows two alternative, but equivalent, definitions of "gate pitch" for a logic gate connected between two contacts. The linear cross-hatched segments represent polysilicon gate lines formed over an active region. The contacts connect to the source/drain regions in the active region of the logic transistor.

As discussed in the Background section, soft-error rate (SER) is a huge concern in nanometer technology generations. The SRAM cell design and device features impact the SER performance. Tightened N-well space (or less P-well area) and lower NMOS device active area ratio (N OD area to cell size) are very import factors for cell SER reduction. An optimized cell structure for a single-port SRAM cell has a X/Y pitch ratio within a range of about 2~2.25 for high-density cells (i.e., optimizing cell size) or about 2.5~2.75 for high-current cells (i.e., optimizing cell speed and SER performance). This cell structure can be combined with tightened N-well space (or less P-well area) and lower NMOS device active area ratio (less N OD area on cell) can be used for SER improvement.

While optimizing SRAM cell device performance, the designer must not only be concerned with device performance, but also with Static Noise Margin (SNM) and transistor mismatch induced cell stability issues. The use of smaller cell transistors in smaller cells places increased emphasis on these issues. In the past, designers usually used narrow transistor pitch (when compared to logic transistor pitch) in the SRAM cell to improve the cell shrink ratio. Any gate length shrinkage must be accounted for in the device's control capability and data stability. For cell matching and cell Vcc-min performance, the inventor has learned that given the same SRAM cell size, gate length (Lg) is more important than channel width (as defined by the active region). Using Vcc-min improvement ratio to benchmark the importance of increases to Lg and channel width, the Lg to channel weight factor is around 2-3 times given the same cell area impact. Given these findings and considerations, a cell structure is proposed that uses a new pitch setting to maintain cell size advantage but also provide better Vcc-min performance.

For a SRAM cell device that has a larger gate pitch than the logic minimum gate pitch, the major difference in gate pitch is from gate length but some of the difference can be attributed to contact-to-polysilicon (CO/Pl) spacing. Logic devices usually use smaller gate length for improved drive current as well as lower gate capacitance. In SRAM cells, longer gate lengths are used for device matching improvement and sub-threshold leakage reduction. For CO/Pl spacing, SRAM designs are usually pushed more than those of surrounding logic devices. For this reason, previous single-port SRAM devices had SRAM cell gate pitches that were equal or less than the logic minimum gate pitch despite the longer gate lengths in the SRAM device. In the new cell design disclosed herein, a narrower CO/Pl spacing than surrounding logic transistors is used, as with previous SRAM devices, but an enlarged gate length is employed with respect to the surrounding minimum gate length logic devices, resulting in a larger gate pitch in the SRAM cell than the logic minimum gate pitch despite narrower CO/Pl spacing.

For example, the pull-down (PD) device is the key transistor in the SRAM cell for cell stability. In embodiments of the new cell design, this transistor has a longer gate length that the gate length of the logic transistor having the minimum logic gate pitch (i.e., the gate pitch of those transistors that have the minimum logic size (gate length)). The pull-up (PU) and pass-gate (PG) devices may have substantially the same gate length as the PD transistor or different gate lengths, e.g., different gate lengths for PD (narrow) and PG (longer) may be used for cell beta ratio setting. In embodiments, the gate length of the pull-down (PD) transistor logic transistor of the SRAM cell may be at least about 1.3× the gate length of the logic transistor having minimum logic gate pitch rather than around 1.1×-1.2× in prior designs. In embodiments of a 32 nm technology generation, the gate length of the pull-down transistor may be 39 nm and that of the minimum logic transistor may be 30 nm.

Given the number of devices and embedded SRAM in one chip (like a CPU and SOCs), power line routing is another import factor to maintain chip performance (lower IR drop). A new metal scheme (multiple layers thick metal for power routing) is also proposed in combination with the new cell design to reduce IR drop, thereby providing best chip performance as well as lower Vcc-min performance.

Figure 3:
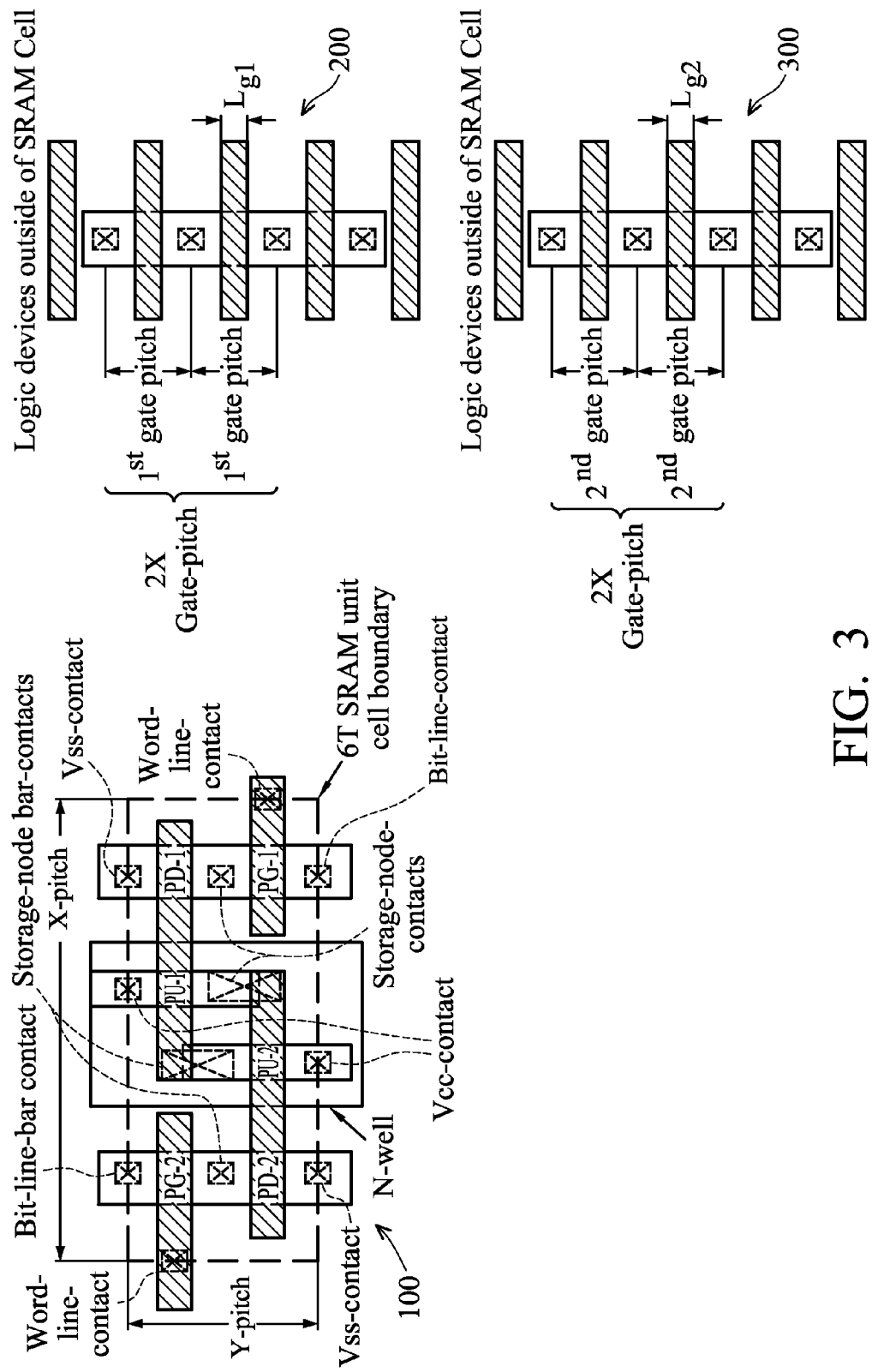
FIG. 3 illustrates a device layout for a chip device having an embedded SRAM array of six transistor single-port SRAM cells.

FIG. 3 illustrates a device (e.g., chip) having an embedded SRAM cell array. The SRAM cell array is formed in area 100. It should be understood that the SRAM cell array includes a plurality of rows and columns of individual SRAM cells, though for illustrative purposes only, a single unit cell is shown, specifically the cell layout for a six transistor SRAM unit cell for discussion of the unit cell design. As can be seen from the figure, the six transistor SRAM unit cell includes gate poly lines corresponding to the six transistors, labeled PG-1 and PG-2 (for the pass gates), PU-1 and PU-2 (for the pull-up transistors) and PD-1 and PD-2 (for the pull-down transistors). The active regions, an N-well formed between two P-well regions, and various contacts are also illustrated. As will be understood by those familiar with this art, the active areas are separated from each other by a field isolation, such as a shallow trench isolation (STI) region.

The SRAM cell illustrated in FIG. 3 occupies a cell area defined by its X-pitch (defined in the direction of the poly gates) and its Y-pitch (defined in the direction orthogonal to the poly gates). The X-pitch is defined between the two word line contacts. The Y-pitch is defined between the VSS and bit-line or bit-line bar contacts and is equal to the combined gate pitch of PD-1/PG-1, PG-2/PD-2 or PU-1/PU-2. In order to optimize device performance, the cell is preferably a thin-style cell layout, meaning the X cell pitch is two or more times the Y cell pitch. In exemplary embodiments, a 6T SRAM unit cell is optimized for cell size and SER performance (i.e., the X-pitch is about 2 to 2.5 times the Y-pitch) or cell speed (i.e., the X-pitch is about 2.5 to 2.75 times the Y-pitch). For a 32 nm generation, the cell area of each SRAM unit cell is preferably 0.2 $\mu m^2$ or less. For example, for this generation, for optimized cell size/SER (i.e., ratio of 2~2.25), the cell size is less than 0.16 $\mu m^2$. For optimized cell speed (i.e., ratio of 2.5~2.75), the cell size is less than 0.2 $\mu m^2$.

As shown in FIG. 3, the chip includes two or more logic devices that fall outside of the SRAM cells, specifically at least a first group of logic devices 200 and a second group of logic devices 300. The gate layer layout of these logic devices and those in the SRAM array have the same routing direction. In embodiments, the first logic transistors can form the word-line driver circuitry for the SRAM array and are electrically connected to the cell word-line. Non-limiting examples of the second logic transistors include transistors in surrounding NAND, NOR, inverter or column selection circuitry. The transistors of the first group of logic transistors 200 have a first gate pitch and the transistors of the second group of logic transistors 300 have a second gate pitch. The first gate pitch is larger than the second gate pitch. The second gate pitch is the minimum logic gate pitch for the chip (i.e., the smallest gate pitch of all logic devices formed outside of the SRAM array where gate pitch is defined between two contacts in the manner shown in FIG. 2).

At least a portion of the difference in gate pitch between the first and second gate pitches can be due to the difference in gate length ($L_g$) between the first and second logic gates in groups 200, 300. For example, for a 32 nm technology generation, the gate length Lg2 of the second logic gate transistors is the minimum gate length for devices in the chip and may be between 28-32 nm and the gate length Lg1 of the first logic transistors may be between 35-45 nm. The first gate pitch (L1) may be between about 135-140 nm and the second gate pitch (L2) may be between about 115 to 130 nm.

As discussed above, in the past, designers usually used narrow transistor pitch (when compared to logic transistor pitch) in the SRAM cell to improve the cell shrink ratio. But, for cell matching and cell Vcc-min performance, the inventor has learned that given the same SRAM cell size, gate length (Lg) is more important than channel width (as defined by the active region). As such, a cell structure is proposed that uses a new pitch setting to maintain cell size advantage but also provide better Vcc-min performance. The exemplary SRAM unit cell conforms to the following rules. The Y-pitch of the SRAM unit cell is equal to about twice the first gate pitch (L1), and the ratio of the Y-pitch to twice the second gate pitch (2×L2) (i.e., two times the minimum logic gate pitch) is greater than 1. In exemplary embodiments, the ratio of the Y-pitch to twice the second gate pitch is substantially greater than one, for example between about 1.019 to 1.08 times greater. In one example, for the 32 nm generation, the gate pitch L2 is 130 nm (Lg2: 30 nm; contact size: 40 nm; and CO/Pl: 30 nm), the gate pitch L1 is 135 nm (Lg1: 35 nm; contact size: 40 nm; and CO/Pl: 30 nm; or Lg1: 30 nm; contact size: 40 nm; and CO/Pl: 32.5 nm), and the Y-pitch is 270 nm for a ratio of Y-pitch to twice the second gate pitch (2×L2) of 1.038. In this embodiment, to satisfy Y-pitch equal 2×L2, the sizes with the SRAM are as follows: Lg: 35 to 50 nm; contact size: 40 nm, and CO/Pl: 30 to 22.5 nm.

The new setting discussed above uses a cell device pitch that is larger than the surrounding logic minimum gate pitch.

If maintaining the cell scaling ratio is desired, there is a tradeoff in the X-Y pitches of the cell in this design. That is, when the gate length is increased (thus widening the Y-pitch of the cell), there is a need to narrow the channel width (narrow down the X-pitch) to maintain the final unit cell area size. The channel width within the SRAM will be narrower than that in the logic portion so as to maintain the cell size. Thus, in certain embodiments, the SRAM cell has a device pitch that is larger than the surrounding logic minimum gate pitch but a narrow channel width (when compared with, for example, the channel width of a logic transistor of the same dopant type having a minimum logic transistor width) to meet the target cell size. Using the 32 nm generation as an example, the PMOS pull up width may be about 40 to 60 nm whereas the logic PMOS width outside the SRAM may be between 80 to 3000 nm. The NMOS pass gate width may be between about 60 to 120 nm, whereas the NMOS logic width outside of the SRAM may be between about 100 to 3000 nm. This design provides the advantages of Vcc-min reduction, device matching and SER performance.

The device structure described above also exhibits better SER reliability due to lower collection area (NMOS active area) on storage node. That is, narrowing the pass gate/pull down channel width reduces both cell size and the collection area for electron-hole pairs (generated by alpha-particles or cosmic-rays), which reduces alpha-particle and cosmic-ray induced discharge electron hole pairs.

Figure 4:
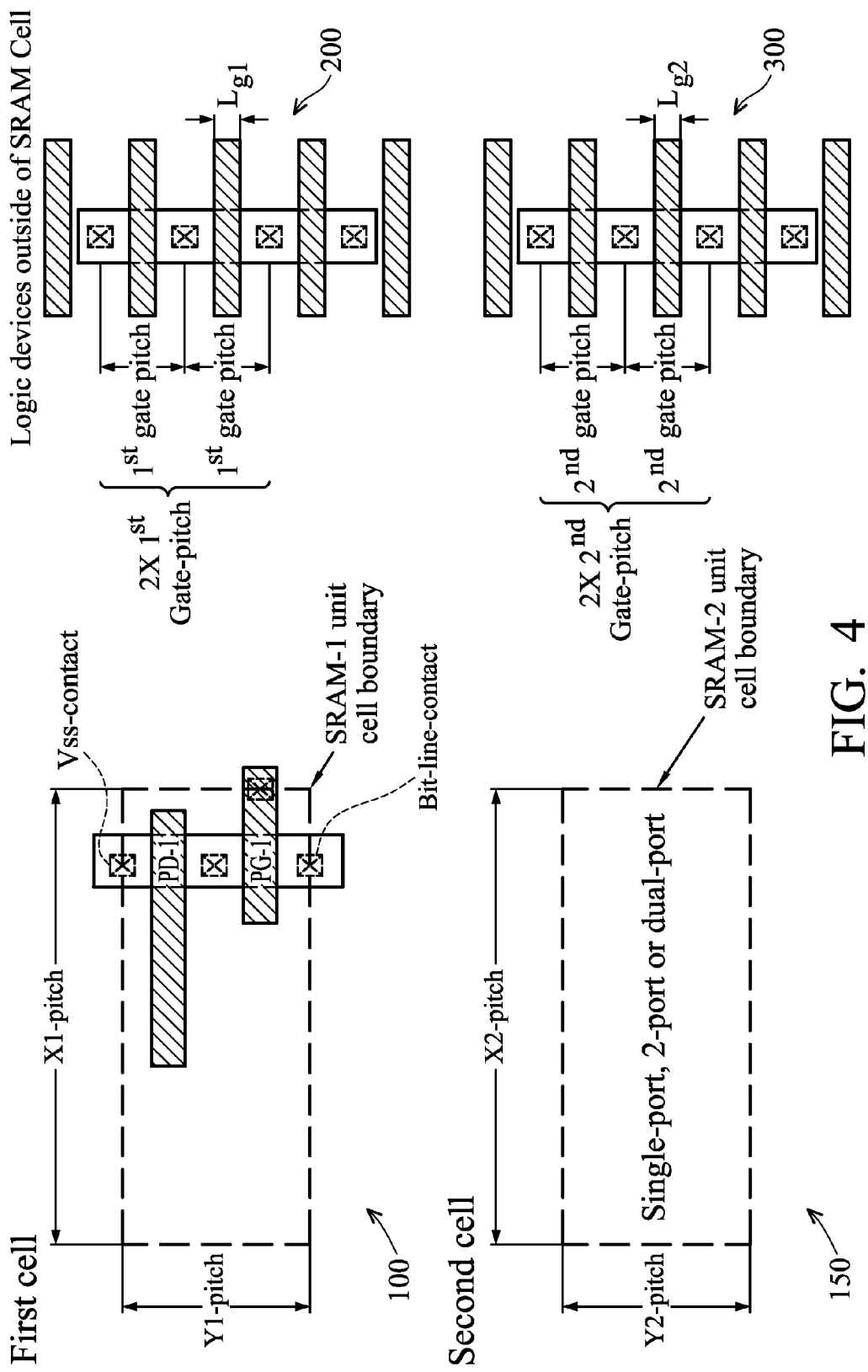
FIG. 4 illustrates a device layout for a chip device having embedded SRAM arrays of different designs.

FIG. 4 shows that additional cells of the single-port, 2-port or dual-port variety can be included in a second SRAM cell array area 150. The first array in area 100 includes device cells where the Y-pitch is defined by the combined gate pitches of the pull-down transistor and pass-gate transistor. As with the SRAM cells in area 100 discussed above in connection with FIG. 3, the SRAM cells in area 150 also are defined by their X- and Y-pitches, labeled X2-pitch and Y2-pitch. In this embodiment, regardless of whether the cells in second array area 150 are of the single-port, 2-port or dual-port variety, the design rule calls for the cells to have the same Y-pitch as the single-port cells in area 100. That is, Y1-pitch equals Y2 pitch for the multiple SRAM cell arrays. This approach simplifies the design loading when multiple types of cells are integrated in one chip. This design rule applies to any cell style (single-port/two port/dual port and others) with matched cell Y-pitch that is the sum of two cell device pitches, e.g., the PD (pull-down transistor) gate pitch and PG (pass gate transistor) gate pitch. The combination of cells in area 100 and 150 can be single-port cells optimized for different reasons and thus having different X-pitches (e.g., X1-pitch is between about 2-2.25 times Y1- and Y2-pitches and X2-pitch is between about 2.5-2.75 time Y1- and Y2-pitches), or single-port and two-port, or single-port and dual port, or other SRAM cells in one chip or combinations thereof.

Figure 4A:
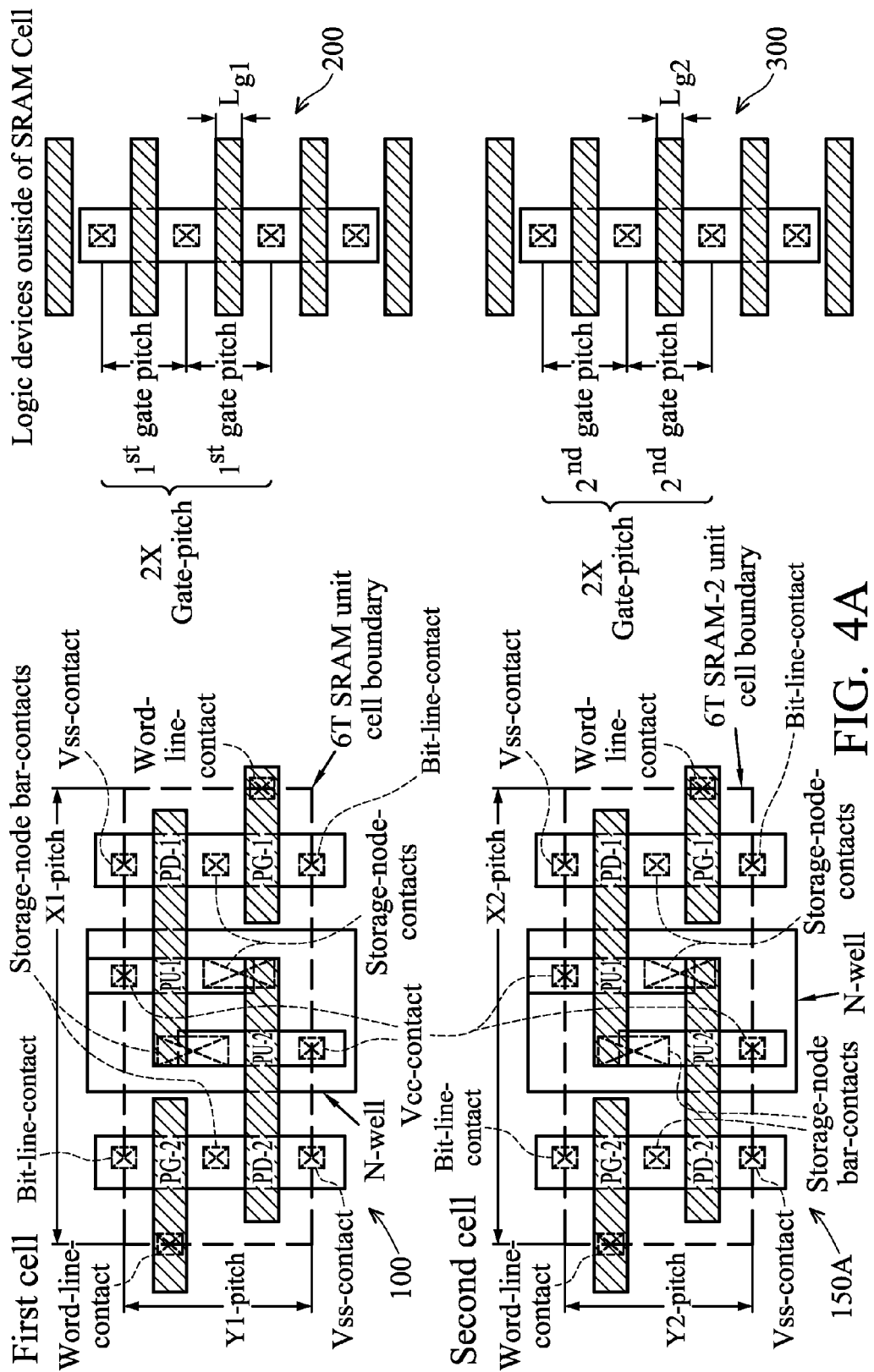
FIG. 4A illustrates the device layout for a chip device having two embedded single-port SRAM arrays.

FIG. 4A illustrates an embodiment where the cells in the second area 150A are of six transistor single-port SRAM cell type. The Y1- and Y2-pitches are the same. The X2 pitch of the second cell is larger than the X1-pitch of the first cell, meaning it is a thin style cell optimized for cell speed and SER performance rather than cell size.

Figure 4B:
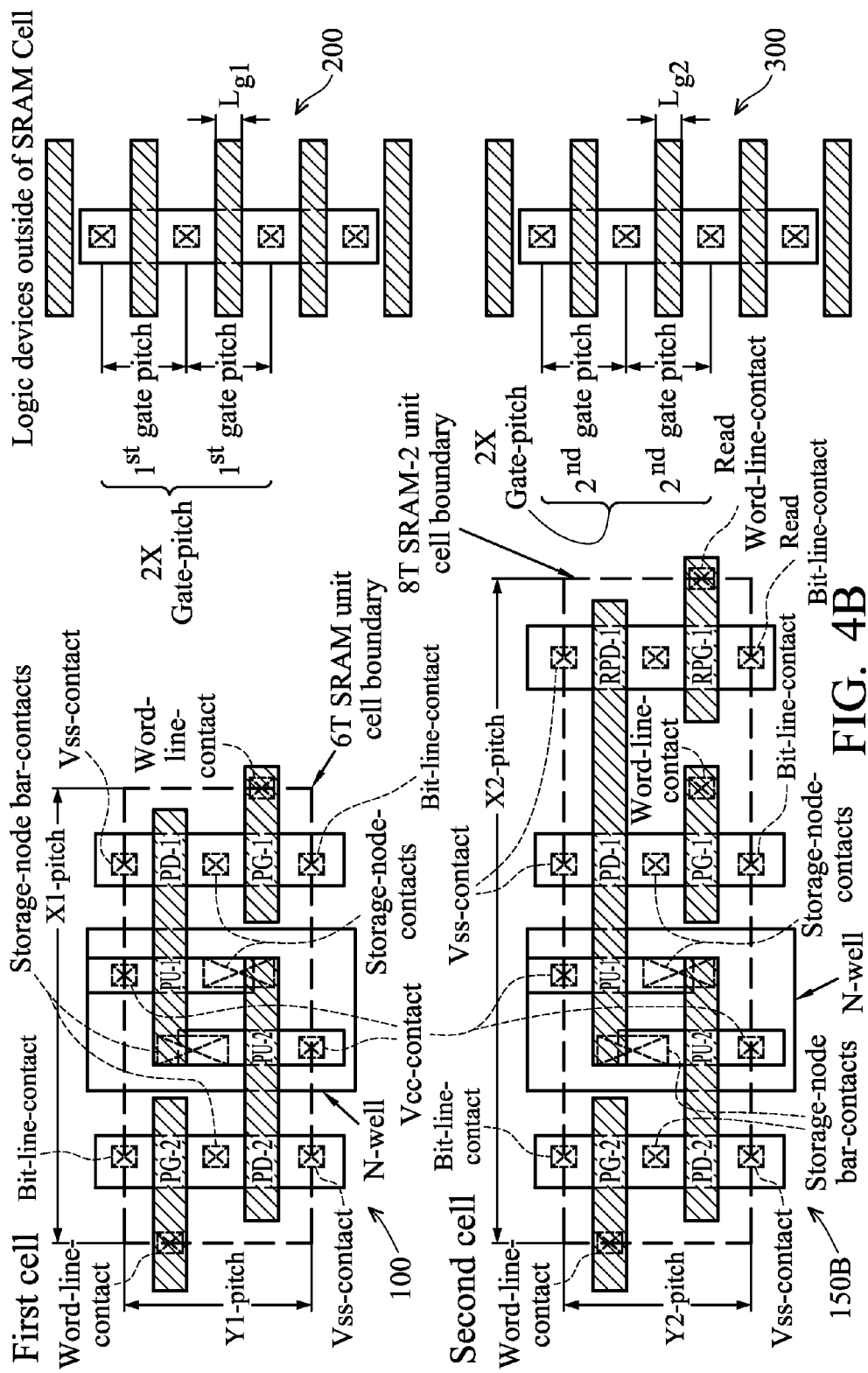
FIG. 4B illustrates a device layout for a chip device having an embedded SRAM array of six transistor single-port SRAM cells and an array of eight transistor two-port SRAM cells.

FIG. 4B illustrates an embodiment where the cells in the second area 150A are of the eight transistor two-port SRAM cell type. The Y1- and Y2-pitches are the same. The X2-pitch of the second cell is larger than the X1-pitch of the first cell. In an optimized thin-style two-port SRAM cell, the X2-pitch is about 3.75-4.25 times the Y-2 pitch.

Figure 4C:
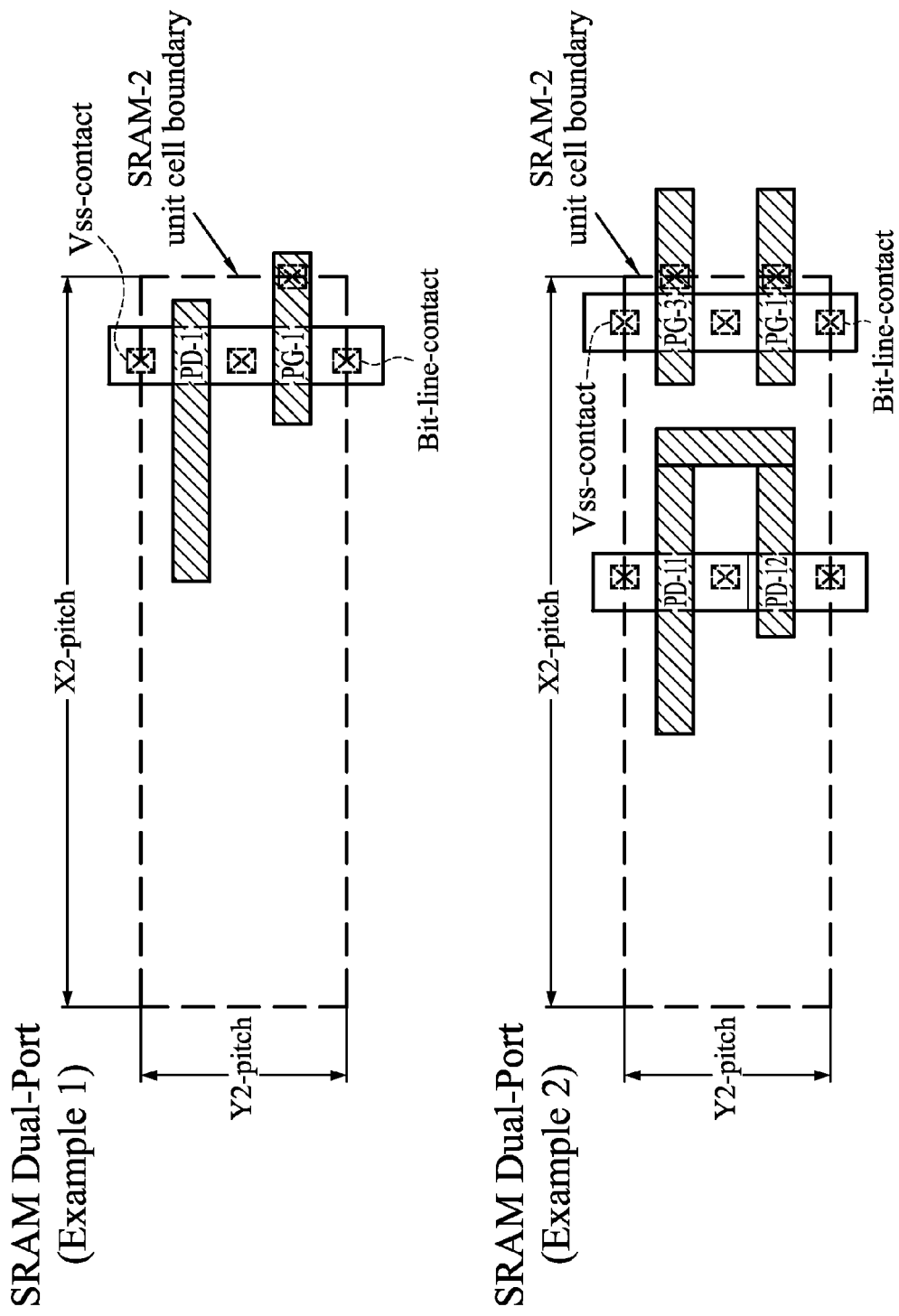
FIG. 4C illustrates two examples of devices that define the unit cell Y-pitch of a the dual-port SRAM unit cell.

The second SRAM array can also include SRAM cells of the eight transistor dual-port cell type in SRAM array area 150. There are many different layouts for eight-transistor dual-port SRAM cells so FIG. 4C illustrates the transistor connections that define the SRAM unit cell's Y-pitch for two popular designs. In example 1, the combined gate pitches of the pull-down transistor and pass-gate transistor define the cell's Y-pitch, as with single-port and 2-port examples of FIGS. 4A and 4B. In example 2, the combined pitches of two cascaded pass-gate transistors or of two cascaded pull-down transistors define the unit cell's Y-pitch. In an optimized thin-style dual-port SRAM cell, the X-pitch is about 5.0-5.7 times the Y-pitch.

Though the transistors illustrated in the figures are of the conventional planar form, it should be understood that non-planar transistor structures (i.e., the so-called Finfet device) may also be used. Each transistor can be either a planar transistor, a Finfet device or multiple Finfet devices, or combination thereof.

Given the number of devices and embedded SRAM in one chip (like CPUs and SOCs), power line routing is an import factor, in addition to cell design, for maintaining chip performance through lowering IR drop. A metal scheme is provided that can be combined with the new cell rules discussed above to reduce IR drop, and therefore provide enhanced chip performance as well as lower Vcc-min performance.

Figure 5:
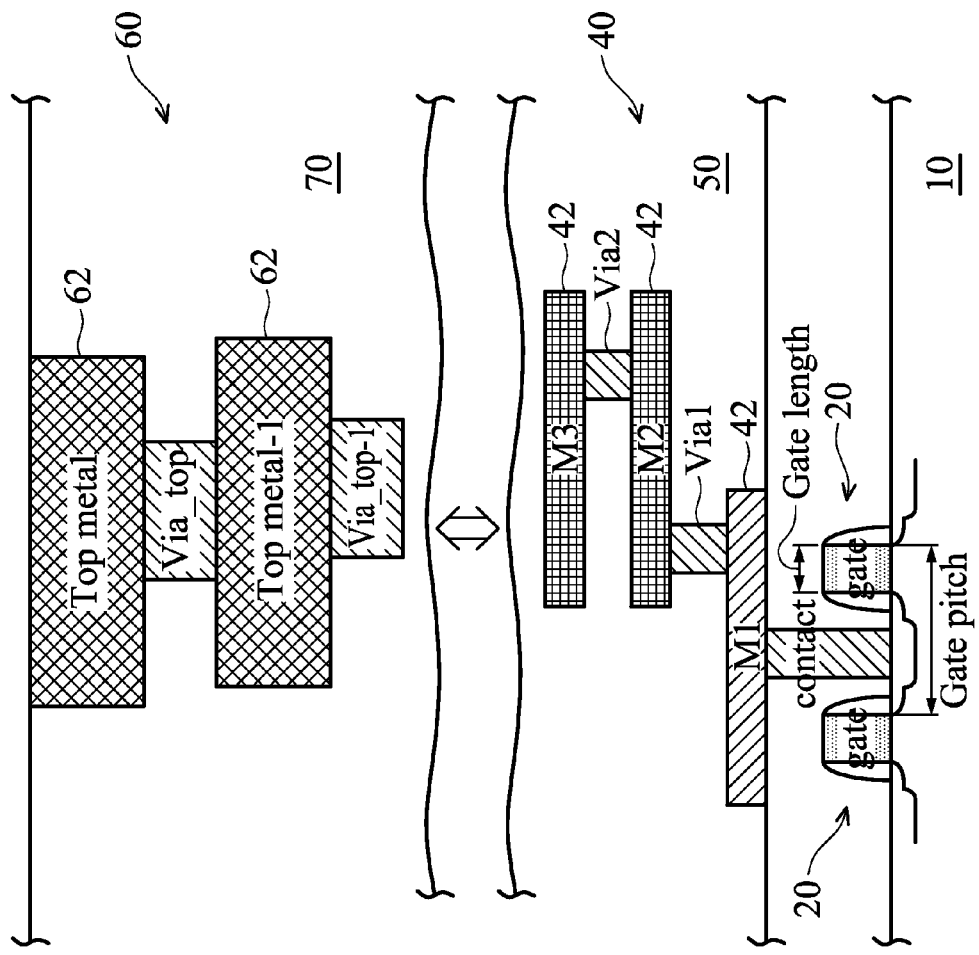
FIG. 5 illustrates an exemplary metallization structure for reducing IR losses in a high gate count SRAM chip.

FIG. 5 illustrates an embodiment of the metallization structure for a chip having an embedded SRAM array. The SRAM and other devices are formed in and on a substrate 10. Two transistors 20 of the SRAM array are shown, each having a gate pitch as identified in FIG. 5. A first group of metallization layers 40 is formed over the transistors 20 and a second group of metallization layers 60 is formed over the first group of metallization layers 40.

The top metals of the first group of one or more metallization layers 60 are used for power routing and require a very low metal resistance for IR drop reduction. In embodiments of the invention, at least two very thick metal layers 62 are used to handle the high power requirements of high gate count chips. These top metal layers preferably are made of copper and are formed in a low-k dielectric layer 70.

Lower level metal layers 42 are used for signal and interconnect routing and require tighter metal pitch (or rule) to provide the best routing efficiency. In exemplary embodiments, the thickness of an individual metal layer 62 is at least six times greater than the thickness of a metal layer 42. The metal layers 42 preferably are also made of copper and are formed in a dielectric layer 50, which has a dielectric constant higher than that of low-k dielectric material 70. In one embodiment, metal line 62 may have a thickness between about 0.8 to 3 µm and metal line 42 may have a thickness between about 0.05 to 1.5 µm.)

Though not shown in FIG. 5, an aluminum-based metal routing layer may be formed over the thick top power metal group 60 and connected thereto. This aluminum metallization is used for chip bonding pads or a combination of chip bonding pad and power routing line. A polyimide layer can be disposed over the Al base metal layer. More specifically, this polyimide layer is disposed upon a passivation layer (e.g., oxide or $Si_3N_4$ layer). The purpose of this layer can be preventing or reducing alpha particle infiltration to reduce SER and/or for package reliability improvement (e.g., reduced stress). The layer is disposed over the passivation layer and, as would be understood by those in this art, windows are opened for chip bonding.

As cell sizes continues shrink, the above-described design rules can be used with optimized thin-style cell structures for either high-density or high-current and lower VCC-min application. The design affords improved SER reliability, static noise margin and transistor match. The design rules allow simplified designs for manufacturing new chip structures where multiple kinds of SRAM cells are integrated in a single chip. That is, providing all SRAM cells with one Y-pitch simplifies the design loading when multiple cells types are using in one chip, for example where the cell Y-pitch is determined by the sum of the pull-down and pass-gate pitches. The improved cell design rules have particular applicability to 32 nm and smaller technology generations, allowing continued scaling of SRAM cell size for these generations. Using an improved metal routing structure in connection with the improved SRAM cell design provides further device performance benefits.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An embedded static random access memory (SRAM) chip in a 32 nm or smaller technology generation, comprising:
   a first SRAM array of first SRAM unit cells, each first SRAM unit cell comprising at least six transistors forming a data latch for data storage and at least two pass gates for data reading and writing access, each unit cell occupying a cell area defined by a first X-pitch and a first Y-pitch, the first X-pitch being longer than the first Y-pitch; and
   a plurality of logic transistors formed outside of the first SRAM array, the plurality of logic transistors including at least a first logic transistor having a first gate pitch and a second logic transistor having a second gate pitch, wherein the gate pitches are defined between source and drain contacts of the first and second logic transistors, respectively, wherein the second gate pitch is the minimum logic gate pitch for the plurality of logic transistors,
   wherein the first Y-pitch is equal to twice the first gate pitch and the ratio of the first Y-pitch to twice the second logic gate pitch is greater than one.

2. The embedded SRAM chip of claim 1, wherein the ratio of the first Y-pitch to twice the second logic gate pitch is between about 1.019-1.08.

3. The embedded SRAM chip of claim 1, wherein the first logic transistor forms part of a word line driver circuit.

4. The embedded SRAM chip of claim 1, wherein the first SRAM array is an array of single-port SRAM cells and the X-pitch is about 2-2.25 times greater than the first Y-pitch.

5. The embedded SRAM chip of claim 1, wherein the first SRAM array is an array of single-port SRAM cells and the first X-pitch is about 2.5-2.75 times greater than the first Y-pitch.

6. The embedded SRAM chip of claim 1, wherein the data latch includes a pair of pull-up transistors and a pair of pull-down transistors, wherein the pull-down transistors and the pass gate transistors have substantially the same gate pitches.

7. The embedded SRAM chip of claim 1, wherein the data latch includes a pair of pull-up transistors and a pair of pull-down transistors, wherein a gate length of the pull-down transistors is at least about 1.3 times larger than a gate length of the second logic transistor.

8. The embedded SRAM chip of claim 1, wherein the SRAM array is an array of single-port SRAM cells and the cell area of each SRAM unit cell is 0.2 $\mu m^2$ or less.

9. The embedded SRAM chip of claim 1,
wherein the first SRAM array is an array of single-port SRAM cells,
wherein the SRAM chip further comprises a second SRAM array of second SRAM unit cells, wherein the second SRAM array is an array of two-port SRAM cells or an array of dual-port SRAM cells, each two-port or dual-port SRAM cell comprising at least eight transistors forming a data latch for data storage and at least at least four pass gates for data reading and writing access, each second SRAM unit cell occupying a second cell area defined by a second X-pitch and a second Y-pitch, the second X-pitch being longer than the second Y-pitch,
wherein the first and second Y-pitches are substantially the same, and
wherein the second X-pitch is greater than the first X-pitch.

10. The embedded SRAM chip of claim 9,
wherein the first X-pitch is about 2.0 to 2.25 or about 2.5-2.75 times greater than the first Y-pitch, and
wherein the second SRAM array is an array of dual-port SRAM cells and the second X-pitch is about 5-5.7 times greater than the second Y-pitch.

11. The embedded SRAM chip of claim 9,
wherein the first X-pitch is about 2.0-2.25 or 2.5-2.75 times greater than the first Y-pitch, and
wherein the second SRAM array is an array of two-port SRAM cells and the second X-pitch is about 3.75-4.25 times greater than the second Y-pitch.

12. The embedded SRAM chip of claim 1, further comprising:
a first group of metallization layers disposed over the first SRAM array, the first group of metallization layers including at least two metallization layers, each metallization layer having a first metal thickness; and
a second group of metallization layers disposed over the first group of metallization layers, the second group of metallization layers including at least two metallization layers having a second metal thickness,
wherein the second metal thickness is at least six times thicker than the first metal thickness.

13. The embedded SRAM chip of claim 12, wherein the first group of metallization layers are formed in a low-k dielectric material and the second group of metallization layers are formed in a dielectric material having dielectric constant greater than the low-k dielectric material.

14. The embedded SRAM chip of claim 1, wherein the first X-pitch is at least twice the first Y-pitch.

15. The embedded SRAM chip of claim 1, wherein the data latch includes a pair of pull-up transistors and a pair of pull-down transistors, wherein an active area of at least one of the pull-up transistors, the pull-down transistors and the pass gate transistors has a channel width that is less than a channel width of a logic transistor of the same dopant type having a minimum logic transistor width.

16. An embedded static random access memory (SRAM) chip comprising:
a first SRAM array of first SRAM unit cells, each first SRAM unit cell comprising at least six transistors forming a data latch for data storage and at least two pass gates for data reading and writing access, each first SRAM unit cell occupying a cell area defined by a first X-pitch and a first Y-pitch, the first X-pitch being longer than the first Y-pitch;
a second SRAM array of second SRAM unit cells, each second SRAM unit cell comprising at least six transistors forming a data latch for data storage and at least two pass gates for data reading and writing access, each second SRAM unit cell occupying a cell area defined by a second X-pitch and a second Y-pitch, the second X-pitch being longer than the second Y-pitch; and
a plurality of logic transistors formed outside of the first SRAM array, the plurality of logic transistors including at least a first logic transistor having a first gate pitch and a second logic transistor having a second gate pitch, wherein the first and second gate pitches are defined between the source and drain contacts of the first and second transistors, respectively, wherein the second gate pitch is the minimum logic gate pitch for the plurality of logic transistors,
wherein the first and second SRAM unit cells differ in one or both of SRAM cell type and X-pitch,
wherein the first and second Y-pitches are substantially equal, and
wherein the first Y-pitch is equal to twice the first gate pitch and the ratio of the first Y-pitch to twice the second logic gate pitch is greater than one.

17. The embedded SRAM chip of claim 16, wherein the first SRAM unit cell and second SRAM unit cell are selected from the SRAM cell type group consisting of single-port SRAM cell, 2-port SRAM cell and dual-port SRAM cell.

18. The embedded SRAM chip of claim 16, wherein the first and second X-pitches are at least twice the first and second Y-pitches, respectively.

19. An embedded static random access memory (SRAM) chip in a 32 nm or lower technology generation, comprising:
a SRAM array of first SRAM unit cells, each SRAM unit cell comprising a first pull-up transistor and first pull-down transistors connected together to form a first inverter, a second pull-up transistors and a second pull-down transistor connected together to form a second inverter, wherein the first and second inverters are cross-coupled to form a data latch for data storage, and at least first and second pass gates for data reading and writing access to the data latch, each unit cell occupying a cell area defined by an X-pitch and a Y-pitch, the X-pitch being longer than the Y-pitch, wherein the Y-pitch is equal to a combined gate pitches of the first pull-down transistor and first pass gate or a combined gate pitches of the second pull-down transistor and second pass gate; and
a plurality of logic transistors formed outside of the first SRAM array, the plurality of logic transistors including at least a first logic transistor having a first gate pitch and a second logic transistor having a second gate pitch, wherein the gate pitches are defined between the source and drain contacts of the first and second transistors, respectively, wherein the second gate pitch is the minimum logic gate pitch for the plurality of logic transistors,
wherein the X-pitch is at least twice the Y-pitch,
wherein the Y-pitch is equal to twice the first gate pitch and the ratio of the first Y-pitch to twice the second logic gate pitch is substantially greater than one, and
wherein an active area of at least one of the pull-up transistors, the pull-down transistors and the pass gate transistors has a channel width that is less than a channel width of a logic transistor of the same dopant type having a minimum logic transistor width.

20. The embedded SRAM chip of claim 19, wherein a gate length of the pull-down transistors is at least about 1.3 times larger than a gate length of the second logic transistor.

21. The embedded SRAM chip of claim 20, wherein the second logic transistor is part of a word-line driver circuit.

* * * * *